(12) United States Patent
Popovich et al.

(10) Patent No.: US 10,409,144 B2
(45) Date of Patent: Sep. 10, 2019

(54) DIFFRACTIVE WAVEGUIDE PROVIDING STRUCTURED ILLUMINATION FOR OBJECT DETECTION

(71) Applicant: DigiLens, Inc., Sunnyvale, CA (US)

(72) Inventors: Milan Momcilo Popovich, Leicester (GB); Jonathan David Waldern, Los Altos Hills, CA (US)

(73) Assignee: DigiLens Inc., Sunnyvale, CA (US)

( * ) Notice: Subject to any disclaimer, the term of this patent is extended or adjusted under 35 U.S.C. 154(b) by 0 days.

(21) Appl. No.: 15/670,875

(22) Filed: Aug. 7, 2017

(65) Prior Publication Data

US 2017/0356801 A1 Dec. 14, 2017
US 2019/0212195 A9 Jul. 11, 2019

Related U.S. Application Data

(63) Continuation of application No. 14/545,578, filed on May 26, 2015, now Pat. No. 9,726,540, which is a
(Continued)

(51) Int. Cl.
*G03B 21/00* (2006.01)
*G02B 6/02* (2006.01)
(Continued)

(52) U.S. Cl.
CPC .......... *G03B 21/005* (2013.01); *G01J 3/1895* (2013.01); *G02B 6/02076* (2013.01);
(Continued)

(58) Field of Classification Search
CPC .... G01J 3/1895; G02B 6/02076; G02F 1/225; G03B 21/005; G03F 7/70316; H01L 33/10; H04N 9/315; H04N 9/3173
See application file for complete search history.

(56) References Cited

U.S. PATENT DOCUMENTS 4,035,068 A 7/1977 Rawson
4,765,703 A 8/1988 Suzuki et al.
(Continued)

FOREIGN PATENT DOCUMENTS

EP 0795775 A2 9/1997
EP 1347641 9/2003
(Continued)

OTHER PUBLICATIONS

International Search Report for PCT/GB2010/001920, Completed by the European Patent Office dated Mar. 29, 2011, 6 Pages.
(Continued)

*Primary Examiner* — Sultan Chowdhury
*Assistant Examiner* — Magda Cruz
(74) *Attorney, Agent, or Firm* — KPPB LLP

(57) ABSTRACT

A projection display device comprising a light source and an SBG device having a multiplicity of separate SBG elements sandwiched between transparent substrates to which transparent electrodes have been applied. The substrates function as a light guide. A least one transparent electrode comprises a plurality of independently switchable transparent electrode elements, each electrode element substantially overlaying a unique SBG element. Each SBG element encodes image information to be projected on an image surface. Light coupled into the light guide undergoes total internal reflection until diffracted out to the light guide by an activated SBG element. The SBG diffracts light out of the light guide to form an image region on an image surface when subjected to an applied voltage via said transparent electrodes.

20 Claims, 7 Drawing Sheets

Related U.S. Application Data continuation of application No. 13/506,389, filed on Apr. 17, 2012, now Pat. No. 9,075,184, which is a continuation of application No. PCT/GB2010/001920, filed on Oct. 7, 2010.

(60) Provisional application No. 61/272,601, filed on Oct. 9, 2009.

(51) Int. Cl.
    *H01L 33/10*     (2010.01)
    *G01J 3/18*     (2006.01)
    *G03F 7/20*     (2006.01)
    *H04N 9/31*     (2006.01)
    *G02F 1/225*     (2006.01)

(52) U.S. Cl.
    CPC .......... *G02F 1/225* (2013.01); *G03F 7/70316* (2013.01); *H01L 33/10* (2013.01); *H04N 9/315* (2013.01); *H04N 9/3173* (2013.01)

(56) References Cited

U.S. PATENT DOCUMENTS

| | | | |
|---|---|---|---|
| 4,964,701 A | 10/1990 | Dorschner et al. | |
| 5,009,483 A | 4/1991 | Rockwell et al. | |
| 5,099,343 A | 3/1992 | Margerum et al. | |
| 5,119,454 A | 6/1992 | McMahon et al. | |
| 5,148,302 A | 9/1992 | Nagano et al. | |
| 5,150,234 A | 9/1992 | Takahashi et al. | |
| 5,224,198 A | 6/1993 | Jachimowicz et al. | |
| 5,251,048 A | 10/1993 | Doane et al. | |
| 5,264,950 A | 11/1993 | West et al. | |
| 5,296,967 A | 3/1994 | Moskovich et al. | |
| 5,309,283 A | 5/1994 | Kreitzer et al. | |
| 5,313,330 A | 5/1994 | Betensky | |
| 5,410,370 A | 4/1995 | Janssen | |
| 5,416,514 A | 5/1995 | Janssen et al. | |
| 5,418,871 A | 5/1995 | Revelli et al. | |
| 5,465,311 A | 11/1995 | Caulfield et al. | |
| 5,532,875 A | 7/1996 | Betemsky | |
| 5,621,529 A | 4/1997 | Gordon et al. | |
| 5,706,136 A | 1/1998 | Okuyama et al. | |
| 5,751,452 A | 5/1998 | Tanaka et al. | |
| 5,808,804 A | 9/1998 | Moskovich | |
| 5,835,661 A | 11/1998 | Tai et al. | |
| 5,841,587 A | 11/1998 | Moskovich et al. | |
| 5,856,842 A | 1/1999 | Tedesco | |
| 5,870,228 A | 2/1999 | Kreitzer et al. | |
| 5,875,012 A | 2/1999 | Crawford et al. | |
| 5,930,433 A | 7/1999 | Williamson et al. | |
| 5,942,157 A | 8/1999 | Sutherland et al. | |
| 5,963,375 A | 10/1999 | Kreitzer | |
| 5,986,746 A | 11/1999 | Metz et al. | |
| 6,014,187 A | 1/2000 | Taketomi et al. | |
| 6,069,728 A | 5/2000 | Huignard et al. | |
| 6,133,971 A | 10/2000 | Silverstein et al. | |
| 6,141,074 A | 10/2000 | Bos et al. | |
| 6,169,594 B1 | 1/2001 | Aye et al. | |
| 6,169,613 B1 | 1/2001 | Amitai et al. | |
| 6,414,760 B1 | 7/2002 | Lopez et al. | |
| 6,449,095 B1 | 9/2002 | Ohtaki et al. | |
| 6,504,629 B1 | 1/2003 | Popovich et al. | |
| 6,567,573 B1 | 5/2003 | Domash et al. | |
| 6,577,429 B1 | 6/2003 | Kurtz et al. | |
| 6,594,090 B2 | 7/2003 | Kruschwitz et al. | |
| 6,597,475 B1 | 7/2003 | Shirakura et al. | |
| 6,600,590 B2 | 7/2003 | Roddy et al. | |
| 6,625,381 B2 | 9/2003 | Roddy et al. | |
| 6,805,490 B2 | 10/2004 | Levola | |
| 6,825,987 B2 | 11/2004 | Repetto et al. | |
| 6,829,095 B2 | 12/2004 | Amitai | |
| 6,833,955 B2 | 12/2004 | Niv | |
| 6,847,488 B2 | 1/2005 | Travis | |
| 7,009,773 B2 | 3/2006 | Chaoulov et al. | |
| 7,068,405 B2 | 6/2006 | Sutherland et al. | |
| 7,149,385 B2 | 12/2006 | Parikka et al. | |
| 7,181,108 B2 | 2/2007 | Levola | |
| 7,206,107 B2 | 4/2007 | Levola | |
| 7,391,573 B2 | 6/2008 | Amitai | |
| 7,418,170 B2 | 8/2008 | Mukawa et al. | |
| 7,453,612 B2 | 11/2008 | Mukawa | |
| 7,457,040 B2 | 11/2008 | Amitai | |
| 7,499,217 B2 | 3/2009 | Cakmakci et al. | |
| 7,577,326 B2 | 8/2009 | Amitai | |
| 7,589,901 B2 | 9/2009 | DeJong et al. | |
| 7,672,055 B2 | 3/2010 | Amitai | |
| 7,672,549 B2 | 3/2010 | Ghosh et al. | |
| 7,724,443 B2 | 5/2010 | Amitai | |
| 7,740,387 B2 | 6/2010 | Schultz et al. | |
| 7,747,113 B2 | 6/2010 | Mukawa et al. | |
| 7,751,122 B2 | 7/2010 | Amitai | |
| 7,751,662 B2 | 7/2010 | Kleemann et al. | |
| 7,764,413 B2 | 7/2010 | Levola | |
| 7,866,869 B2 | 1/2011 | Karakawa | |
| 7,907,342 B2 | 3/2011 | Simmonds et al. | |
| 7,949,214 B2 | 5/2011 | DeJong et al. | |
| 7,969,657 B2 | 6/2011 | Cakmakci et al. | |
| 8,000,020 B2 | 8/2011 | Amitai et al. | |
| 8,018,579 B1 | 9/2011 | Krah | |
| 8,023,783 B2 | 9/2011 | Mukawa et al. | |
| 8,073,296 B2 | 12/2011 | Mukawa et al. | |
| 8,098,439 B2 | 1/2012 | Amitai et al. | |
| 8,107,023 B2 | 1/2012 | Simmonds et al. | |
| 8,107,780 B2 | 1/2012 | Simmonds | |
| 8,155,489 B2 | 4/2012 | Saarikko et al. | |
| 8,160,411 B2 | 4/2012 | Levola et al. | |
| 8,194,325 B2 | 6/2012 | Levola et al. | |
| 8,213,065 B2 | 7/2012 | Mukawa | |
| 8,213,755 B2 | 7/2012 | Mukawa et al. | |
| 8,220,966 B2 | 7/2012 | Mukawa | |
| 8,224,133 B2 * | 7/2012 | Popovich ............... | G02B 27/48 385/10 |
| 8,233,204 B1 | 7/2012 | Robbins et al. | |
| 8,314,993 B2 | 11/2012 | Levola et al. | |
| 8,320,032 B2 | 11/2012 | Levola | |
| 8,325,166 B2 | 12/2012 | Akutsu et al. | |
| 8,354,640 B2 | 1/2013 | Hamre et al. | |
| 8,355,610 B2 | 1/2013 | Simmonds | |
| 8,369,019 B2 | 2/2013 | Baker et al. | |
| 8,376,548 B2 | 2/2013 | Schultz | |
| 8,382,293 B2 | 2/2013 | Phillips, III et al. | |
| 8,396,339 B2 | 3/2013 | Mukawa et al. | |
| 8,422,840 B2 | 4/2013 | Large | |
| 8,432,614 B2 | 4/2013 | Amitai | |
| 8,466,953 B2 | 6/2013 | Levola et al. | |
| 8,491,136 B2 | 7/2013 | Travis et al. | |
| 8,493,662 B2 | 7/2013 | Noui | |
| 8,547,638 B2 | 10/2013 | Levola | |
| 8,548,290 B2 | 10/2013 | Travers et al. | |
| 8,582,206 B2 | 11/2013 | Travis | |
| 8,593,734 B2 | 11/2013 | Laakkonen | |
| 8,611,014 B2 | 12/2013 | Valera et al. | |
| 8,634,120 B2 | 1/2014 | Popovich et al. | |
| 8,639,072 B2 | 1/2014 | Popovich et al. | |
| 8,643,948 B2 | 2/2014 | Amitai et al. | |
| 8,649,099 B2 | 2/2014 | Schultz et al. | |
| 8,654,420 B2 | 2/2014 | Simmonds | |
| 8,698,705 B2 | 4/2014 | Burke et al. | |
| 8,731,350 B1 | 5/2014 | Lin et al. | |
| 8,736,963 B2 | 5/2014 | Robbins et al. | |
| 8,810,913 B2 | 8/2014 | Simmonds et al. | |
| 8,810,914 B2 | 8/2014 | Amitai | |
| 8,817,350 B1 | 8/2014 | Robbins et al. | |
| 8,824,836 B2 | 9/2014 | Sugiyama et al. | |
| 8,830,584 B2 | 9/2014 | Saarikko et al. | |
| 8,842,368 B2 | 9/2014 | Simmonds et al. | |
| 8,873,149 B2 | 10/2014 | Bohn et al. | |
| 8,873,150 B2 | 10/2014 | Amitai | |
| 8,903,207 B1 | 12/2014 | Brown et al. | |
| 8,913,865 B1 | 12/2014 | Bennett | |
| 8,917,453 B2 | 12/2014 | Bohn et al. | |
| 8,985,803 B2 | 3/2015 | Bohn et al. | |
| 8,989,535 B2 | 3/2015 | Robbins | |

(56) References Cited

U.S. PATENT DOCUMENTS

| | | |
|---|---|---|
| 9,019,595 B2 | 4/2015 | Jain |
| 9,025,253 B2 | 5/2015 | Hadad et al. |
| 9,075,184 B2 | 7/2015 | Popovich et al. |
| 9,164,290 B2 | 10/2015 | Robbins et al. |
| 9,201,270 B2 | 12/2015 | Fattal et al. |
| 9,274,338 B2 | 3/2016 | Robbins et al. |
| 9,310,566 B2 | 4/2016 | Valera et al. |
| 9,341,846 B2 | 5/2016 | Popovich et al. |
| 9,372,347 B1 | 6/2016 | Levola et al. |
| 9,377,623 B2 | 6/2016 | Robbins et al. |
| 9,389,415 B2 | 7/2016 | Fattal et al. |
| 9,400,395 B2 | 7/2016 | Travers et al. |
| 9,423,360 B1 | 8/2016 | Kostamo et al. |
| 9,431,794 B2 | 8/2016 | Jain |
| 9,459,451 B2 | 10/2016 | Saarikko et al. |
| 9,465,213 B2 | 10/2016 | Simmonds |
| 9,494,799 B2 | 11/2016 | Robbins et al. |
| 9,551,874 B2 | 1/2017 | Amitai et al. |
| 9,551,880 B2 | 1/2017 | Amitai et al. |
| 9,612,403 B2 | 4/2017 | Abovitz et al. |
| 9,651,368 B2 | 5/2017 | Abovitz et al. |
| 9,664,824 B2 | 5/2017 | Simmonds et al. |
| 9,727,772 B2 | 8/2017 | Popovich et al. |
| 9,746,688 B2 | 8/2017 | Popovich et al. |
| 2002/0047837 A1 | 4/2002 | Suyama et al. |
| 2002/0075240 A1 | 6/2002 | Lieberman et al. |
| 2003/0067685 A1 | 4/2003 | Niv |
| 2004/0004767 A1 | 1/2004 | Song |
| 2004/0141217 A1 | 7/2004 | Endo et al. |
| 2005/0180687 A1 | 8/2005 | Amitai |
| 2005/0232530 A1 | 10/2005 | Kekas et al. |
| 2006/0181683 A1 | 8/2006 | Bhowmik et al. |
| 2006/0221063 A1 | 10/2006 | Ishihara |
| 2007/0041684 A1 | 2/2007 | Popovich et al. |
| 2007/0070504 A1 | 3/2007 | Akutsu et al. |
| 2007/0109400 A1 | 5/2007 | Woodgate et al. |
| 2007/0127348 A1 | 6/2007 | Ooi et al. |
| 2007/0146624 A1 | 6/2007 | Duston et al. |
| 2007/0195409 A1 | 8/2007 | Yun et al. |
| 2008/0198471 A1 | 8/2008 | Amitai |
| 2008/0285137 A1 | 11/2008 | Simmonds et al. |
| 2008/0297731 A1 | 12/2008 | Powell et al. |
| 2009/0052047 A1 | 2/2009 | Amitai |
| 2009/0128495 A1 | 5/2009 | Kong et al. |
| 2009/0141324 A1 | 6/2009 | Mukawa |
| 2009/0190222 A1 | 7/2009 | Simmonds et al. |
| 2009/0303599 A1 | 12/2009 | Levola |
| 2010/0039796 A1 | 2/2010 | Mukawa |
| 2010/0053565 A1 | 3/2010 | Mizushima et al. |
| 2010/0097674 A1 | 4/2010 | Kasazumi et al. |
| 2010/0202725 A1* | 8/2010 | Popovich .............. G02B 27/48 385/10 |
| 2010/0225834 A1 | 9/2010 | Li |
| 2010/0246003 A1 | 9/2010 | Simmonds et al. |
| 2010/0246004 A1 | 9/2010 | Simmonds |
| 2010/0284085 A1 | 11/2010 | Laakkonen |
| 2010/0284090 A1 | 11/2010 | Simmonds et al. |
| 2010/0284180 A1 | 11/2010 | Popovich et al. |
| 2010/0321781 A1 | 12/2010 | Levola et al. |
| 2011/0026128 A1 | 2/2011 | Baker et al. |
| 2011/0032706 A1 | 2/2011 | Mukawa |
| 2011/0063604 A1 | 3/2011 | Hamre et al. |
| 2011/0235179 A1 | 9/2011 | Simmonds |
| 2011/0242661 A1 | 10/2011 | Simmonds |
| 2011/0242670 A1 | 10/2011 | Simmonds |
| 2012/0033306 A1 | 2/2012 | Valera et al. |
| 2012/0044572 A1 | 2/2012 | Simmonds et al. |
| 2012/0062850 A1 | 3/2012 | Travis |
| 2012/0081789 A1 | 4/2012 | Mukawa et al. |
| 2012/0120493 A1 | 5/2012 | Simmonds et al. |
| 2012/0206811 A1 | 8/2012 | Mukawa et al. |
| 2012/0207432 A1 | 8/2012 | Travis et al. |
| 2012/0207434 A1 | 8/2012 | Large et al. |
| 2012/0300311 A1 | 11/2012 | Simmonds et al. |
| 2012/0326950 A1 | 12/2012 | Park et al. |
| 2013/0016324 A1 | 1/2013 | Travis |
| 2013/0021392 A1 | 1/2013 | Travis |
| 2013/0021586 A1 | 1/2013 | Lippey |
| 2013/0039619 A1 | 2/2013 | Laughlin et al. |
| 2013/0044376 A1 | 2/2013 | Valera et al. |
| 2013/0077049 A1 | 3/2013 | Bohn |
| 2013/0088637 A1 | 4/2013 | Duparre |
| 2013/0107186 A1 | 5/2013 | Ando et al. |
| 2013/0163089 A1 | 6/2013 | Bohn et al. |
| 2013/0229717 A1 | 9/2013 | Amitai |
| 2013/0250430 A1 | 9/2013 | Robbins et al. |
| 2013/0250431 A1 | 9/2013 | Robbins et al. |
| 2013/0271731 A1 | 10/2013 | Popovich et al. |
| 2013/0322810 A1 | 12/2013 | Robbins |
| 2014/0003762 A1 | 1/2014 | Macnamara |
| 2014/0043672 A1 | 2/2014 | Clarke et al. |
| 2014/0104665 A1 | 4/2014 | Popovich et al. |
| 2014/0140653 A1 | 5/2014 | Brown et al. |
| 2014/0140654 A1 | 5/2014 | Brown et al. |
| 2014/0168735 A1 | 6/2014 | Yuan et al. |
| 2014/0185286 A1 | 7/2014 | Popovich et al. |
| 2014/0218801 A1 | 8/2014 | Simmonds et al. |
| 2014/0232759 A1 | 8/2014 | Simmonds et al. |
| 2014/0240834 A1 | 8/2014 | Mason et al. |
| 2014/0267420 A1 | 9/2014 | Schowengerdt et al. |
| 2014/0300966 A1 | 10/2014 | Travers et al. |
| 2015/0010265 A1 | 1/2015 | Popovich et al. |
| 2015/0125109 A1 | 5/2015 | Robbins et al. |
| 2015/0185475 A1 | 7/2015 | Saarikko et al. |
| 2015/0247975 A1 | 9/2015 | Abovitz et al. |
| 2015/0260994 A1 | 9/2015 | Akutsu et al. |
| 2015/0277375 A1 | 10/2015 | Large et al. |
| 2016/0004090 A1 | 1/2016 | Popovich et al. |
| 2016/0077338 A1 | 3/2016 | Robbins et al. |
| 2016/0085300 A1 | 3/2016 | Robbins et al. |
| 2016/0116739 A1 | 4/2016 | Tekolste et al. |
| 2016/0231570 A1 | 8/2016 | Levola et al. |
| 2016/0320536 A1 | 11/2016 | Simmonds et al. |
| 2016/0327705 A1 | 11/2016 | Simmonds et al. |
| 2016/0341964 A1 | 11/2016 | Amitai et al. |
| 2017/0031171 A1 | 2/2017 | Vallius et al. |
| 2017/0034435 A1 | 2/2017 | Vallius et al. |
| 2017/0102543 A1 | 4/2017 | Vallius et al. |
| 2017/0123208 A1 | 5/2017 | Vallius et al. |
| 2017/0131546 A1 | 5/2017 | Woltman et al. |
| 2017/0131551 A1 | 5/2017 | Robbins et al. |
| 2017/0219841 A1 | 8/2017 | Popovich et al. |
| 2017/0299860 A1 | 10/2017 | Juhola et al. |
| 2018/0011324 A1 | 1/2018 | Popovich et al. |
| 2018/0059305 A1 | 3/2018 | Popovich et al. |
| 2018/0246354 A1 | 8/2018 | Popovich et al. |
| 2018/0275402 A1 | 9/2018 | Popovich et al. |

FOREIGN PATENT DOCUMENTS

| | | |
|---|---|---|
| EP | 1748305 A1 | 1/2007 |
| EP | 2110701 A1 | 10/2009 |
| EP | 1828832 B1 | 5/2013 |
| EP | 2733517 A1 | 5/2014 |
| EP | 1573369 B1 | 7/2014 |
| EP | 2995986 A1 | 3/2016 |
| GB | 2508661 A | 6/2014 |
| GB | 2514658 A | 12/2014 |
| JP | 2000026259 A | 2/2000 |
| JP | 2000267042 A | 9/2000 |
| JP | 2002162598 A | 6/2002 |
| JP | 2009036955 A | 2/2009 |
| TW | 201314263 A | 4/2013 |
| WO | 2000016136 A1 | 3/2000 |
| WO | 0023832 | 4/2000 |
| WO | 2000023847 | 4/2000 |
| WO | 2002082168 A1 | 10/2002 |
| WO | 2003081320 A1 | 10/2003 |
| WO | 2004102226 | 11/2004 |
| WO | 2005073798 A1 | 8/2005 |
| WO | 2006064301 A1 | 6/2006 |
| WO | 2006064325 A1 | 6/2006 |
| WO | 2006064334 A1 | 6/2006 |
| WO | 2006102073 A2 | 9/2006 |

(56) References Cited

FOREIGN PATENT DOCUMENTS

| | | | |
|---|---|---|---|
| WO | 2006132614 A1 | 12/2006 |
| WO | 2006102073 A3 | 1/2007 |
| WO | 2007029032 A1 | 3/2007 |
| WO | 2007130130 | 11/2007 |
| WO | 2007141587 A1 | 12/2007 |
| WO | 2007141589 A1 | 12/2007 |
| WO | 2009013597 | 1/2009 |
| WO | 2009013597 A2 | 1/2009 |
| WO | 2009077802 A1 | 6/2009 |
| WO | 2007130130 A3 | 9/2009 |
| WO | 2010023444 A1 | 3/2010 |
| WO | 2010067114 A1 | 6/2010 |
| WO | 2010104692 A2 | 9/2010 |
| WO | 2010122330 A1 | 10/2010 |
| WO | 2010125337 A2 | 11/2010 |
| WO | 2011042711 A2 | 4/2011 |
| WO | 2011051660 A1 | 5/2011 |
| WO | 2011073673 A1 | 6/2011 |
| WO | 2011107831 A1 | 9/2011 |
| WO | 2011131978 A1 | 10/2011 |
| WO | 2013102759 A2 | 7/2013 |
| WO | 2014080155 A1 | 5/2014 |
| WO | 2014091200 A1 | 6/2014 |
| WO | 2014100182 A1 | 6/2014 |
| WO | 2014116615 A1 | 7/2014 |
| WO | 2014159621 A1 | 10/2014 |
| WO | 2014210349 A1 | 12/2014 |
| WO | 2015069553 A1 | 5/2015 |
| WO | 2015145119 A1 | 10/2015 |
| WO | 2016020643 A1 | 2/2016 |
| WO | 2016111707 A1 | 7/2016 |
| WO | 2016111708 A1 | 7/2016 |
| WO | 2016111709 A1 | 7/2016 |
| WO | 2016113534 A1 | 7/2016 |
| WO | 2016122679 A1 | 8/2016 |
| WO | 2017060665 A1 | 4/2017 |
| WO | 2017162999 A1 | 9/2017 |
| WO | 2017180403 A1 | 10/2017 |

OTHER PUBLICATIONS

Sagan et al. Proceedings of SPIE Mar. 30, 2001, vol. 4294, pp. 75-83, "Electrically Switchable Bragg Grating Technology for Projection Displays".
Hasman et al. Fibre and Integrated Optics 1997, vol. 16, pp. 1-25, "Diffractive Optics: Design Realisation and Applications".
International Search Report and Written Opinion for International Application No. PCT/US2018/056150, Search completed Dec. 4, 2018, dated Dec. 26, 2018, 10 Pgs.
International Preliminary Report on Patentability for International Application PCT/GB2009/051676, dated Jun. 14, 2011, dated Jun. 23, 2011, 6 pgs.
International Preliminary Report on Patentability for International Application PCT/GB2011/000349, dated Sep 18, 2012, dated Sep 27, 2012, 10 pgs.
International Preliminary Report on Patentability for International Application PCT/GB2012/000677, dated Feb 25, 2014, dated Mar 6, 2014, 5 pgs.
International Preliminary Report on Patentability for International Application PCT/US2014/011736, dated Jul. 21, 2015, dated Jul. 30, 2015, 9 pgs.
International Search Report and Written Opinion for International Application No. PCT/US2014/011736, completed Apr. 18, 2014, dated May 8, 2014, 10 pgs.
International Search Report and Written Opinion for International Application PCT/GB2009/051676, completed May 10, 2010, dated May 18, 2010, 7 pgs.
International Search Report for PCT/GB2011/000349, completed by the European Patent Office dated Aug. 17, 2011, 4 pgs.
International Search Report for PCT/GB2012/000677, completed by the European Patent Office dated Dec. 10, 2012, 4 pgs.

Written Opinion for International Application No. PCT/GB2011/000349, completed Aug. 17, 2011, dated Aug. 25, 2011, 9 pgs.
Written Opinion for International Application No. PCT/GB2012/000677, completed Dec. 10, 2012, dated Dec. 17, 2012, 4 pgs.
"BragGrate—Deflector: Transmitting Volume Bragg Grating for angular selection and magnification", 2015, www.OptiGrate.com.
Al-Kalbani et al., "Ocular Microtremor laser speckle metrology", Proc. of SPIE, 2009, vol. 7176 717606-1, 12 pgs.
An et al., "Speckle suppression in laser display using several partially coherent beams", Optics Express, Jan. 5, 2009, vol. 17, No. 1, pp. 92-103.
Ayras et al., "Exit pupil expander with a large field of view based on diffractive optics", Journal of the SID, May 18, 2009, 17/8, pp. 659-664.
Bleha et al. W P., "D-ILA Technology for High Resolution Projection Displays", Sep. 10, 2003, Proceedings, vol. 5080, doi:10.1117/12.497532, 11 pgs.
Bone, "Design Obstacles for LCOS Displays in Projection Applications "Optics architectures for Lcos are still evolving"", Aurora Systems Inc. Bay Area SID Seminar, Mar. 27, 2001, 22 pgs.
Bowley et al., "Variable-wavelength switchable Bragg gratings formed in polymer-dispersed liquid crystals", Applied Physics Letters, Jul. 2, 2001, vol. 79, No. 1, pp. 9-11.
Brown, "Waveguide Displays", Rockwell Collins, 2015, 11 pgs.
Buckley, "Colour holographic laser projection technology for heads-up and instrument cluster displays", Conference: Proc. SID Conference 14th Annual Symposium on Vehicle Displays, Jan. 2007, 5 pgs.
Buckley et al., "Full colour holographic laser projector HUD", Light Blue Optics Ltd. Aug. 10, 2015, 5 pgs.
Ducharme, "Microlens diffusers for efficient laser speckle generation", Optics Express, Oct. 29, 2007, vol. 15, No. 22, pp. 14573-14579.
Funayama et al., "Proposal of a new type thin film light-waveguide display device using", The International Conference on Electrical Engineering, 2008, No. P-044, 5 pgs.
Han et al., "Study of Holographic Waveguide Display System", Advanced Photonics for Communications, 2014, 4 pgs.
Hoepfner et al., "LED Front Projection Goes Mainstream", Luminus Devices, Inc. Projection Summit, 2008, 18 pgs.
Karp et al., "Planar micro-optic solar concentration using multiple imaging lenses into a common slab waveguide", Proc. of SPIE vol. 7407, 2009 SPIE, CCC code: 0277-786X/09, doi: 10.1117/12.826531, pp. 74070D-1-74070D-11.
Karp et al., "Planar micro-optic solar concentrator", Optics Express, Jan. 18, 2010, vol. 18, No. 2, pp. 1122-1133.
Keuper et al., "26.1: RGB LED Illuminator for Pocket-Sized Projectors", SID 04 Digest, 2004, ISSN/0004-0966X/04/3502, pp. 943-945.
Keuper et al., "P-126: Ultra-Compact LED based Image Projector for Portable Applications", SID 03 Digest, 2003, ISSN/0003-0966X/03/3401-0713, pp. 713-715.
Li et al., "Dual Paraboloid Reflector and Polarization Recycling Systems for Projection Display", Proceedings vol. 5002, Projection Displays IX, Mar. 28, 2003, doi: 10.1117/12.479585, 12 pgs.
Li et al., "Novel Projection Engine with Dual Paraboloid Reflector and Polarization Recovery Systems", Wavien Inc. SPIE EI 5289-38, Jan. 21, 2004, 49 pgs.
Li et al., "Polymer crystallization/melting induced thermal switching in a series of holographically patterned Bragg reflectors", Soft Matter, Jul. 11, 2005, vol. 1, pp. 238-242.
Lu et al., "Polarization switch using thick holographic polymer-dispersed liquid crystal grating", Journal of Applied Physics, Feb. 1, 2004, vol. 95, No. 3, pp. 810-815.
Mach et al., "Switchable Bragg diffraction from liquid crystal in colloid-templated structures", Europhysics Letters, Jun. 1, 2002, vol. 58, No. 5, pp. 679-685.
Miller, "Coupled Wave Theory and Waveguide Applications", The Bell System Technical Journal, Short Hills, NJ, Feb. 2, 1954, 166 pgs.
Paolini et al., "High-Power LED Illuminators in Projection Displays", Lumileds, Aug. 7, 2001, 19 pgs.

(56) References Cited

OTHER PUBLICATIONS

Qi et al., "P-111: Reflective Display Based on Total Internal Reflection and Grating-Grating Coupling", Society for Information Display Digest, May 2003, pp. 648-651, DOI: 10.1889/1.1832359.
Schreiber et al., "Laser display with single-mirror MEMS scanner", Journal of the SID 17/7, 2009, pp. 591-595.
Sutherland et al., "Bragg Gratings in an Acrylate Polymer Consisting of Periodic Polymer-Dispersed Liquid-Crystal Planes", Chem. Mater. 1993, vol. 5, pp. 1533-1538.
Sutherland et al., "Electrically switchable vol. gratings in polymer-dispersed liquid crystals", Applied Physics Letters, Feb. 28, 1994, vol. 64, No. 9, pp. 1074-1076.
Sutherland et al., "Enhancing the electro-optical properties of liquid crystal nanodroplets for switchable Bragg gratings", Proc. of SPIE, 2008, vol. 7050, pp. 705003-1-705003-9, doi: 10.1117/12.792629.
Sutherland et al., "Liquid crystal bragg gratings: dynamic optical elements for spatial light modulators", Hardened Materials Branch, Hardened Materials Branch, AFRL-ML-WP-TP-2007-514, Jan. 2007, Wright-Patterson Air Force Base, OH, 18 pgs.
Trisnadi, "Speckle contrast reduction in laser projection displays", Proc. SPIE 4657, 2002, 7 pgs.
Vita, "Switchable Bragg Gratings", Thesis, Universita degli Studi di Napoli Federico II, Nov. 2005, 103 pgs.
Wang et al., "Liquid-crystal blazed-grating beam deflector", Applied Optics, Dec. 10, 2000, vol. 39, No. 35, pp. 6545-6555.
Wofford et al., "Liquid crystal bragg gratings: dynamic optical elements for spatial light modulators", Hardened Materials Branch, Survivability and Sensor Materials Division, AFRL-ML-WP-TP-2007-551, Air Force Research Laboratory, Jan. 2007, Wright-Patterson Air Force Base, OH, 17 pgs.
Yaqoob et al., "High-speed two-dimensional laser scanner based on Bragg grating stored in photothermorefractive glass", Applied Optics, Sep. 10, 2003, vol. 42, No. 26, pp. 5251-5262.
Yeralan et al., "Switchable Bragg grating devices for telecommunications applications", Opt. Eng. Aug. 2012, vol. 41, No. 8, pp. 1774-1779.

\* cited by examiner

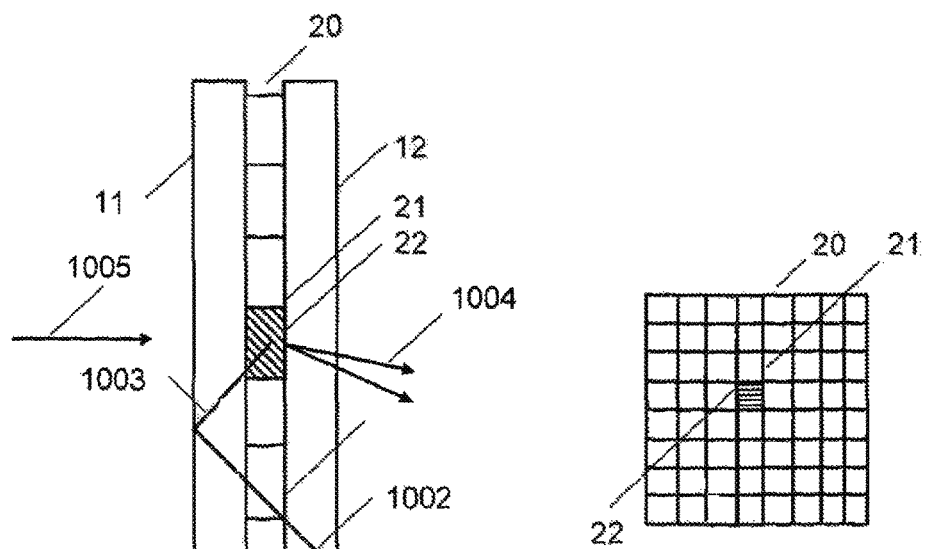
FIG. 1
FIG. 2
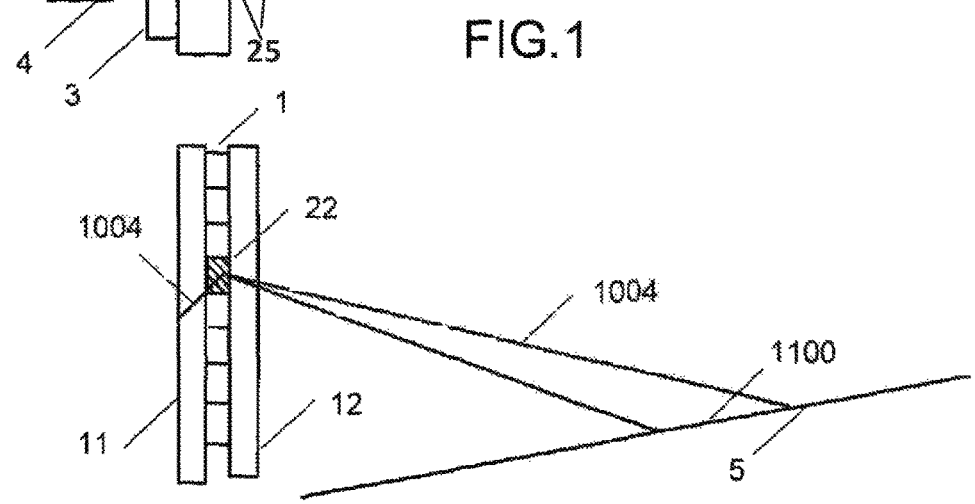
FIG. 3A

DIFFRACTIVE WAVEGUIDE PROVIDING STRUCTURED ILLUMINATION FOR OBJECT DETECTION

CROSS-REFERENCE TO RELATED APPLICATIONS

This application is a continuation of U.S. application Ser. No. 14/545,578 filed May 26, 2015, now U.S. Pat. No. 9,726,540, which is a Continuation of U.S. application Ser. No. 13/506,389 filed Apr. 17, 2012, now U.S. Pat. No. 9,075,184, which is a continuation of U.S. application Ser. No. 15/770,485 filed Apr. 23, 2018, which is a national stage application under 35 USC 371 of PCT Application No. PCT/GB2010/001920 filed Oct. 7, 2010, which claims the benefit of U.S. Provisional Patent Application No. 61/272,601 filed on Oct. 9, 2009.

BACKGROUND

This invention relates to a display device, and more particularly to a compact edge-illuminated projection display based on switchable Bragg gratings.

There is growing consumer demand for projection displays that can be built into mobile devices such as mobile telephones and hand-held computers. However, image sizes and resolutions required for typical applications such as internet browsing or viewing high definition films are already beyond the scope of display technologies currently available for use in mobile devices. New ultra compact projectors known as picoprojectors provide one solution to this problem. Many of the picoprojector designs considered to date rely on conventional flat panel display technologies such as Liquid Crystal Display (LCD) or Digital Light Processor (DLP) technology such as that developed by Texas Instruments (TX). Optical design limits the miniaturization possible with either approach, even when solid state lasers are used as the light source. An alternative approach is to scan the image using micro-optical-electrical-mechanical systems (MOEMS), essentially writing the image using a flying spot. Although MOEMS are much smaller than LCDs or DLPs they present complex opto-mechanical design problems. Very high scanning speeds, resolutions and the tight synchronization of mirror driver and laser modulation are needed in order to deliver high resolution images. Achieving the mechanical robustness required in portable applications is also a challenge. A further problem is that it is also difficult to correct laser speckle in scanned displays.

Desirably, display technologies for portable devices should be very compact with volumes of a few cubic centimeters. A thin form-factor is desirable for ease of integration into devices such as mobile telephones.

There is a requirement for a compact solid-state high-resolution data projection display with a thin form factor.

SUMMARY

It is an object of the present invention to provide compact solid-state high-resolution data projection display with a thin form factor.

A projection display device according to the principles of the invention comprises: a first light source emitting light of a first wavelength; a first SBG device comprising a multiplicity of separately switchable SBG elements disposed in a single layer; transparent substrates sandwiching the SBG device, said substrates together functioning as a first light guide; and a means for coupling the first wavelength light into the first light guide. The first wavelength light undergoes total internal reflection within the first light guide. Transparent electrodes are applied to opposing faces of the substrates. At least one of the transparent electrodes comprises a plurality of independently switchable transparent electrode elements. Each electrode element overlays a unique SBG element. Each SBG element in first SBG device diffracts first wavelength light to form an image region on an image surface when subjected to an applied voltage via the transparent electrodes.

In one embodiment of the invention the image surface is disposed in proximity to the display.

In one embodiment of the invention the image surface is disposed more than 25 centimeters from said display.

In one embodiment of the invention the image surface is disposed more than 50 centimeters from said display.

In one embodiment of the invention one image region comprises an image of a keyboard.

In one embodiment of the invention the image region is an image pixel.

In one embodiment of the invention an SBG element pre-distorts the shape of the image region.

In one embodiment of the invention the image surface is an optical diffusing material.

In one embodiment of the invention the image surface is the retina of an eye.

In one embodiment of the invention the image surface is a curved surface.

In one embodiment of the invention the display further comprises: at least one infrared source; means for directing infrared light from the infrared source towards the image surface and at least one infrared sensor operative to detect light scatter from an object disposed in proximity to the image surface. The infrared source may be a laser. The infrared sensor may comprise an image sensing array and lens.

In one embodiment of the invention the display further comprises: at least one infrared source; means for directing infrared light from the infrared source towards the image surface and at least one infrared sensor operative to detect light scatter from an object disposed in proximity to the image surface. The first SBG device contains at least one infrared diffracting SBG element operative to diffract infrared light from the infrared source towards the image surface when the infrared diffracting SBG element is subjected to an applied voltage via the transparent electrodes.

In one embodiment of the invention that provides full-colour imaging the display further comprises: second and third light sources emitting light of second and third wavelengths; second and third SBG devices each comprising a multiplicity of separately switchable SBG elements disposed in a single layer, the SBG elements of the first second and third SBG devices substantially overlapping each other; transparent substrates sandwiching the second SBG device, said substrates together functioning as a second light guide; transparent substrates sandwiching the third SBG device, said substrates together functioning as a third light guide; and means for coupling the first, second and third wavelength light into the first, second and third light guide. Transparent electrodes are applied to substrate faces in contact with the second and third SBG devices. At least one of the transparent electrodes in contact with the second and third SBG devices comprises a plurality of independently switchable transparent electrodes elements, each of the independently switchable electrodes substantially overlays a unique SBG element. The first, second and third wavelength light undergoes total internal reflection within the light guides, Each element of the second SBG device diffracts second wavelength light to form a second image region on an image surface when subjected to an applied voltage via the transparent electrodes. Each element of the third SBG device diffracts third wavelength light to form a third image region on an image surface when subjected to an applied voltage via the transparent electrodes. The first, second and third image regions substantially overlap.

In one embodiment of the invention that provides full colour imaging SBG elements in the first, second and third wavelength SBG devices are activated in bands. Each band comprises at least one row of SBG elements. Each band is continuously scrolled vertically. At least one band in each of the first, second and third SBG devices is activated at any instant with no overlap occurring between the first, second and third wavelength SBG device bands.

A more complete understanding of the invention can be obtained by considering the following detailed description in conjunction with the accompanying drawings wherein like index numerals indicate like parts. For purposes of clarity details relating to technical material that is known in the technical fields related to the invention have not been described in detail.

BRIEF DESCRIPTION OF THE DRAWINGS

FIG. 1 is a schematic side elevation view of one embodiment of the invention.

FIG. 2 is a schematic front elevation view of a detail of an SBG device in one embodiment of the invention.

FIGS. 3A and 3B are a schematic side elevation view of one embodiment of the invention.

DETAILED DESCRIPTION

Figure 3B:
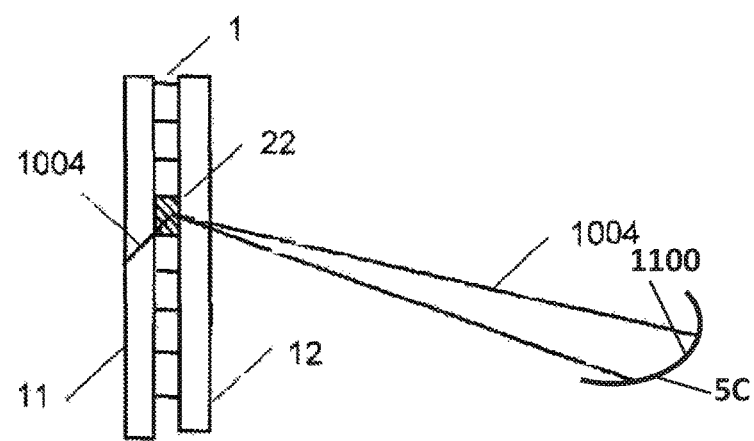

It will apparent to those skilled in the art that the present invention may be practiced with some or all of the present invention as disclosed in the following description. For the purposes of explaining the invention well-known features of optical technology known to those skilled in the art of optical design and visual displays have been omitted or simplified in order not to obscure the basic principles of the invention.

Unless otherwise stated the term "on-axis" in relation to a ray or a beam direction refers to propagation parallel to an axis normal to the surfaces of the optical components used in the embodiments of the invention. In the following description the terms light, ray, beam and direction may be used interchangeably and in association with each other to indicate the direction of propagation of light energy along rectilinear trajectories.

Parts of the following description will be presented using terminology commonly employed by those skilled in the art of optical design.

It should also be noted that in the following description of the invention repeated usage of the phrase "in one embodiment" does not necessarily refer to the same embodiment.

The compact projection display disclosed in the present application is based on a diffractive optical device known as a Switchable Bragg Grating (SBG). A SBG is a Bragg grating recorded into a polymer dispersed liquid crystal (PDLC) mixture. Typically, SBG devices are fabricated by first placing a thin film of a mixture of photopolymerizable monomers and liquid crystal material between parallel glass plates. One or both glass plates support electrodes, typically transparent indium tin oxide films, for applying an electric field across the PDLC layer. A Bragg grating is then recorded by illuminating the liquid material with two mutually coherent laser beams, which interfere to form the desired grating structure. During the recording process, the monomers polymerize and the PDLC mixture undergoes a phase separation, creating regions densely populated by liquid crystal micro-droplets, interspersed with regions of clear polymer. The alternating liquid crystal-rich and liquid crystal-depleted regions form the fringe planes of the grating. The resulting Bragg grating can exhibit very high diffraction efficiency, which may be controlled by the magnitude of the electric field applied across the PDLC layer. In the absence of an applied electric field the SBG remains in its diffracting state. When an electric field is applied to the hologram via the electrodes, the natural orientation of the LC droplets is changed thus reducing the refractive index modulation of the fringes and causing the hologram diffraction efficiency to drop to very low levels. The diffraction efficiency of the device can be adjusted, by means of the applied voltage, over a continuous range from essentially zero to near 100%. U.S. Pat. No. 5,942,157 by Sutherland et al. and U.S. Pat. No. 5,751,452 by Tanaka et al. describe monomer and liquid crystal material combinations suitable for fabricating ESBG devices.

In one embodiment of the invention illustrated in the schematic side elevation view of FIG. 1 there is provided an SBG array device comprising a pair of transparent substrates 11 and 12 and an SBG layer 20 sandwiched between the substrates. The two substrates 11 and 12 together form a light guide. The SBG layer comprises an array of individually switchable SBG elements. As will be discussed below the SBG elements may be switched using a range of spatio-temporal switching schemes, including any of the active matrix switching regimes used in conventional flat panel displays. Typically the substrates will be fabricated from optical glass such as BK7 or a high quality optical plastic.

Transparent electrodes 25 are applied to both of the inner surfaces of the substrates and electrically coupled to a voltage generator (not illustrated). The electrodes are configured such that the applied electric field will be perpendicular to the substrates. Typically, the planar electrode configuration requires low voltages, in the range of 2 to 4 volts per µm. The electrodes would typically be fabricated from Indium Tin Oxide (ITO). Commercially available ITO typically has a coating resistance of typically 300-500 Ohm/sq. An exemplary ITO film used by the inventors is the N00X0325 film manufactured by Applied Films Corporation (Colorado). Typically, ITO films used with the present invention have a thickness of 100 Angstrom.

In one embodiment of the invention the electrode on one substrate surface is uniform and continuous, while the electrode on the opposing substrate surface is patterned to match the shapes of the SBG elements. In an alternative embodiment of the invention the electrodes may be identically patterned such that each SBG element is sandwiched by identical electrodes matching the shape of the SBG element. Desirably, the planar electrodes should be exactly aligned with the SBG elements for optimal switching of the symbols and the elimination of any image artefacts that may result from unswitched grating regions.

In practice the SBG elements will separated by very narrow grating-free regions which are essentially homogenous regions of PDLC that generally do not respond to applied electric fields. Such grating-free regions normally result from masking during fabrication of the SBG device. Techniques for overcoming problems associated with such gaps are disclosed in PCT Application No PCT/US2006/043938 by Popovich et al, entitled "Method and Apparatus for Switching a PDLC device", which is incorporated by reference herein in its entirety, may be used with the present invention. In most applications of the invention the effects on image quality of such gaps between SBG elements are not likely to be significant.

An SBG contains slanted fringes resulting from alternating liquid crystal rich regions and polymer rich (i.e. liquid crystal depleted) regions. SBGs may be configured to be transmissive or reflective according to the slant of the fringes. Reflection SBGs are characterized by fringes that are substantially parallel to the substrates. For the purposes of explaining the invention transmissive SBGs will be assumed in the following description. However, it should be clear that any of the embodiments of the invention may be practiced using either reflective or transmissive SBGs. With no electric field applied, the extraordinary axis of the liquid crystals generally aligns normal to the fringes. The grating thus exhibits high refractive index modulation and high diffraction efficiency for P-polarized light. When an electric field is applied to the SBG, the extraordinary axes of the liquid crystal molecules align parallel to the applied field and hence perpendicular to the substrate. Note that the electric field due to the planar electrodes is perpendicular to the substrate. In this state the grating exhibits lower refractive index modulation and lower diffraction efficiency for both S- and P-polarized light. Thus the grating region no longer diffracts light but rather acts like a transparent plate have little effect on incident light other than a small amount of absorption, scatter and Fresnel reflection loss at the grating-substrate interfaces.

The operation of a compact projection display according to the principles of the invention may be understood with reference to FIGS. 1-3. FIG. 2 shows a front elevation view of the SBG array. FIGS. 3A and 3B show a side elevation view of the display. We consider the case in which one SBG element 22 is in its active or diffracting state and all other SBG elements such as the one indicated by 21 are in their passive or non diffracting states. Input light 1000 from a source 4 is optically coupled to the substrates 11 and 12 via an optical coupling device 3. Light admitted into the light guide undergoes TIR between the outer surfaces of the substrates 11, 12.

Advantageously, the source is a solid state laser. Alternatively, the source may be a Light Emitting Diode (LED). However the broader spectral bandwidth of LEDs will result in some chromatic dispersion at the SBG elements. The coupling device may be a prism or a grating. The invention does not assume any particular method for coupling light into the substrates.

However, a method based on a grating is highly desirable from the perspective of minimizing the thickness of the display. To overcome laser speckle the display would advantageously also incorporate a despeckler such as the one disclosed in the PCT application PCT/IB2008/001909 with International Filing date 22 Jul. 2008 entitled "LASER ILLUMINATION DEVICES" which is incorporated by reference herein in its entirety. The invention may be applied with any other type of despeckler but preferably one based on solid state technology.

The input light 1000 is deflected into the ray direction 1001 by the coupling device 3. The deflection angle in the substrates should exceed the critical angle for the substrate medium to air interface. The ray now follows a TIR path constrained by the outer surfaces of the light guide provided by the substrates. Hence, the ray 1001 is totally internally reflected into the ray path indicated by 1001,1002,1003.

The grating in each SBG element encodes wave-front amplitude and phase modulation information such that that incident TIR light is diffracted to form a focused image region of predefined geometry and luminance distribution at the image surface 5. The light 1003 which impinges on the active SBG element 22 is diffracted towards the image surface 5 as the beam 1004. As indicated in FIGS. 3A and 3B, the diffracted light 1004 forms an image 1100 at the image surface 5 or 5C. Light which does not impinge on the SBG element will hit the substrate-air interface at the critical angle and is therefore totally internally reflected and eventually collected at a beam stop, which is not illustrated. The invention does not assume any particular method for trapping non diffracted light.

The image surface 5 may a diffusing surface of any geometry and as indicated in FIG. 3A may be tilted with respect to the display. In typical applications of the invention the image surface will be a plane. The image surface will most typically will be either parallel to or orthogonal to the grating plane. The image is formed without the need for an additional lens or any other optical element between the SBG array and the surface. Another important feature of the invention is that, since the SBG array elements each contain diffraction patterns, the resolution of the final projected images is much higher than the resolution of the array. The side elevation view of the display of FIG. 1 in which the source and coupling optics are omitted shows the formation of an image element 1100 on the surface 5 by the SBG element 22.

In one embodiment of the invention the image element may be a rectangular pixel having a luminance level determined by the voltage applied across the SBG element. By applying voltages to each SBG in the SBG array a pixelated image is provided over a predefined image area. An SBG element may be designed to provide pre-distortion of the image element geometry to compensate for the effects of off axis projection, such as key-stoning. The invention is not necessarily limited to pixelated display applications. In one embodiment of the invention the image element formed by a SBG element may have an intensity distribution within a predefined area. As will be explained below such an embodiment may be used to provide structured illumination for a range of applications.

The techniques for encoding such optical functions into an SBG are well known to those skilled in the design of Holographic Optical Elements (HOEs) and Diffractive Optical Elements (DOEs). The invention does not rely on any particular method of encoding optical functions into SBGs. Advantageously the SBG element is fabricated by first designing and fabricating a Computer Generated Hologram (CGH) with the required optical properties and then recording the CGH into the ESBG element. The above process is equivalent to forming a hologram of the CGH. The invention does not rely on any particular method for recording the CGH into the SBG.

Any holographic recording techniques known to those skilled in the art of holography may be used. It should be noted that the resulting SBG element is not identical in every respect to the CGH since properties of a CGH rely on its surface phase relief features while the optical characteristics of a Bragg grating such as an SBG rely on a complex three dimensional fringe distribution. The basic principles of computer generated holograms suitable for use in the present invention are discussed in an article entitled HASMAN E et al "Diffractive Optics: Design Realisation and Applications", Fibre and Integrated Optics; 16:1-25, 1997.

It should be clear from consideration of FIGS. 1-3 that a display according to the principles of the invention will be transparent to external ambient light such as the light 1005 indicated in FIG. 1. Since the external light is broadband and incident over a wide range of angles only a small portion of it will be lost due to diffraction at active SBG elements. In other words only a very small portion of the external light will have incidence angles and wavelengths that satisfy the Bragg condition at the active SBG elements. The ex al light will also suffer small transmission loss due to Fresnel reflections, scatter and absorption.

Typically, the image surface is disposed between 25-100 centimeters from the display. However, the distances may be much greater depending on the application and the image brightness requirements. In certain embodiments of the invention the image surface may be very close to the display. In such embodiments the image and image surface may be integrated within a directly viewable display module. However, such embodiments will sacrifice the image magnifications obtained by projecting the image over a longer distance.

Figure 4:
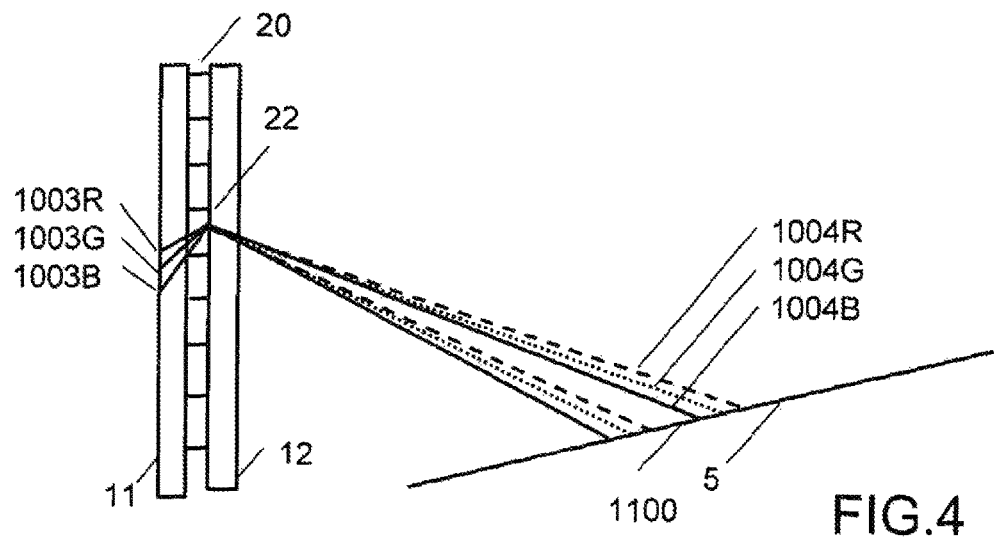
FIG. 4 is a schematic side elevation view of one embodiment of the invention.
Figure 5:
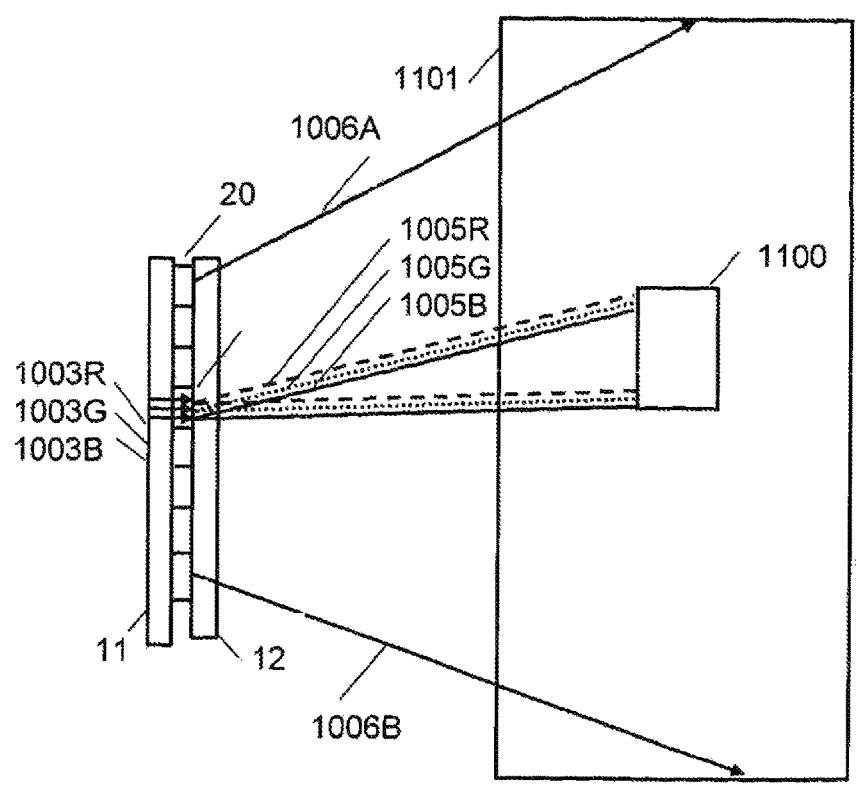
FIG. 5 is a schematic plan view of the embodiment of the invention illustrated in FIG. 4.

In one embodiment of the invention based on the embodiment illustrated in FIGS. 1-3 there is provided a colour projection display. The basic principles of the colour display are illustrated in FIGS. 4-5. Light from separate red green and blue sources is coupled into the light-guide formed by the substrates 11,12. Again the coupling optics, which are not illustrated, may comprise prisms or diffractive elements. Many alternative methods of coupling light from different colour sources into a light guide will be known to those skilled in the art. Desirably, the coupling optics are based on diffractive optical techniques to keep the display as thin as possible. The TIR angle for each colour is constrained such that the incidence angle for a particular colour light at a given SBG satisfy the Bragg condition for diffraction at a specified diffraction angle.

The red, green, blue light is presented sequentially. As indicated in the schematic side elevation view of FIG. 4, incident red, green, blue TIR rays 1003R, 1003G, 1003B at the SBG 22 are diffracted into the red, green, blue image light indicated by 1004R, 1004G, 1004B towards the image surface 5 forming the colour image element 1100. FIG. 5 shows a plan view of the display showing the a plan view of the diffracted beams indicated by 1005R, 1005G, 1005B. The lateral extent of the projected beam is indicated by the rays 1006A, 1006B. Note that in FIGS. 4-5 the separation of the beams has been exaggerated for the purposes of explanation.

Colour imaging may also be provided by stacking red, green, and blue SBG arrays of the type illustrated in FIGS. 1-3 and providing illumination from red, green and blue light sources.

Figure 6:
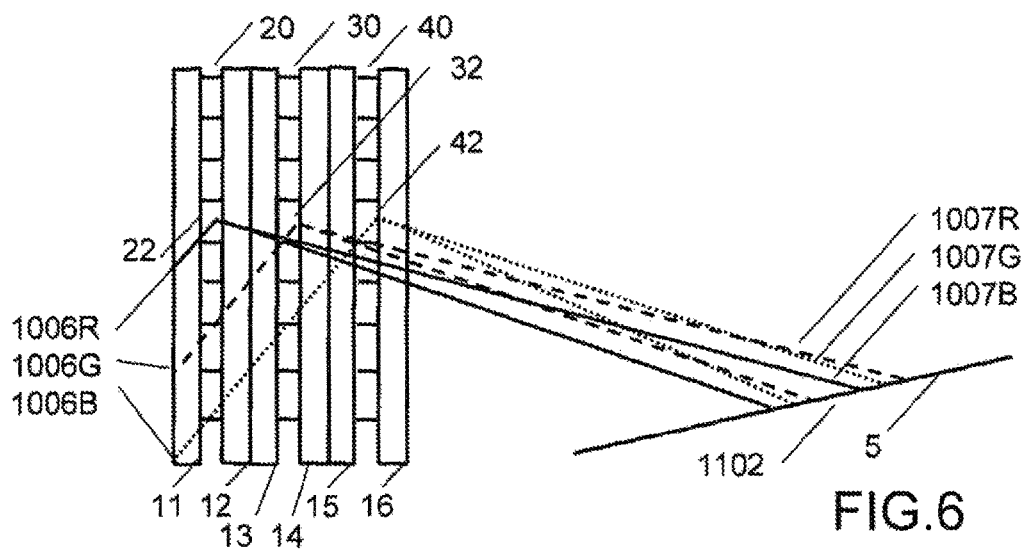
FIG. 6 is a schematic side elevation view of one embodiment of the invention.

Such embodiments of the invention will suffer from the problems of alignment and light transmission loss. In the embodiment of the invention illustrated in the schematic side elevation view of FIG. 6 there are provided red, green and blue diffracting SBG arrays 20,30,40. The SBG arrays are sandwiched between substrates 11,12,13,14,15,16. The substrates are stacked to form a single light guiding structure. Light from separate red, green and blue sources is coupled into the light-guide. Again the preferred coupling optics are based on diffractive optical techniques to keep the display as thin as possible. Since a separate SBG arrays is provided for each colour, the TIR angle may be the same for each colour. The red, green, blue light is presented simultaneously. Referring to FIG. 6 incident red, green and blue light from light sources 1006R, 1006G, 1006B at the active red, green, blue SBG elements 22,32,42 is diffracted into the beams 1007R, 1007G, 1007B forming a colour image element 1102 at the image surface 5. Note that the separation of the beams has again been exaggerated for the purposes of explanation.

In one embodiment of the invention the SBG elements may be switched using a switching scheme commonly referred to as "scrolling". Conventional colour displays rely on providing a single display panel that is updated with red, green and blue picture information in turn and sequentially fully illuminated by red, green and blue illumination. Alternatively, three panel architectures provide separate red, green and blue image panels which are separately fully illuminated by red, green and blue light. Such displays suffer from the problems of having to update the entire red, green or blue images before illumination of the appropriate colour can be applied. In the case of three-panel displays the cost of the display may become prohibitive. A single panel scrolling color projection display system is characterized by a single light modulator panel having a raster of individual picture elements or pixels, which panel is illuminated by horizontally elongated red, green and blue illumination bars or stripes. The stripes are continuously scrolled vertically across the panel while the rows of pixels are synchronously addressed with display information corresponding to the color of the then incident stripe. The modulated scrolling red, green and blue stripes are then projected onto a display screen to produce a visually integrated full color display. Exemplary scrolling displays are disclosed in U.S. Pat. No. 5,410,370, entitled "Single panel color projection video display improved scanning" issued to P. Janssen on Mar. 25, 1994, and U.S. Pat. No. 5,416,514, entitled "Single panel color projection video display having control circuitry for synchronizing the color illumination system with reading/writing of the light valve" issued to P. Janssen et al. on May 16, 1995.

Figure 7:
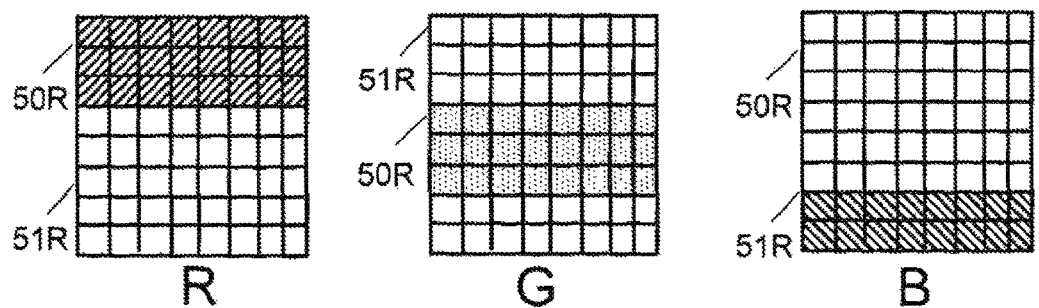
FIG. 7 is a schematic front elevation view of a scrolling SBG device in one embodiment of the invention.

The principles of scrolling may be applied in the present invention by switching rows of SBG elements in sequence. A basic scrolling scheme for use with the present invention is illustrated in FIG. 7. The scrolling scheme may be implemented using the embodiment of FIG. 6. In each SBG device SBG elements are activated in bands comprising at least one row of SBG elements. The bands are continuously scrolled vertically, at least one band in each of the red green and blue SBG devices being activated at any instant, said bands in said first, second and third SBG devices not overlapping. FIG. 7 shows red, green and blue states indicated by symbols R,G,B at one instant in time. In each case, the diffracting rows or bands of SBG elements are shaded. Thus red SBG band 50R, green SBG band 50G and blue SBG band 50B are diffracting while red SBG pixel rows 51R, green SBG pixel rows 51G and blue SBG pixel rows 51B are not diffracting permitting TIR to proceed.

Figures 8, 9:
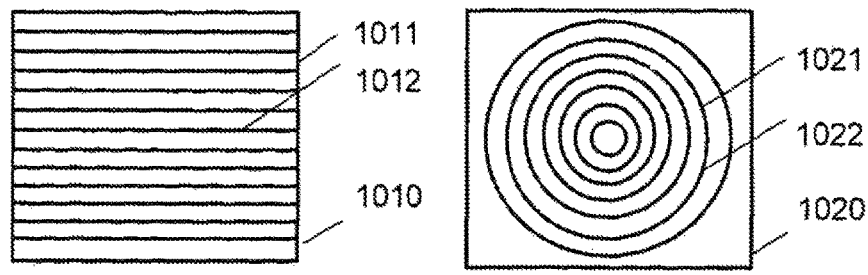
FIG. 8 is a front elevation view of structured illumination provided by one embodiment of the invention.
FIG. 9 is a front elevation view of structured illumination provided by one embodiment of the invention.

In a particular group of embodiments of the invention at least one SBG array element in any of the above described embodiments may provide structured infrared illumination using light from an infra red source. The infrared light would be injected into the light guide formed by the substrates in a similar fashion to the means used to introduce visible light in any of the above embodiments. The infrared source is typically a 780 nm laser. However other near-infrared sources may be used. The structure lighting may comprise parallel bars, concentric circles and other geometrical structures commonly used in the visualization and measurement of three-dimensional shapes. Examples of structures infrared lighting are provided in FIGS. 8-9. In the example shown in FIG. 8 the structured lighting 1010 comprises parallel bars and spaces 1011,1012. In the example shown in FIG. 9 the structure lighting 1020 comprises concentric circles 1021 separated by gaps 1022.

Figure 10:
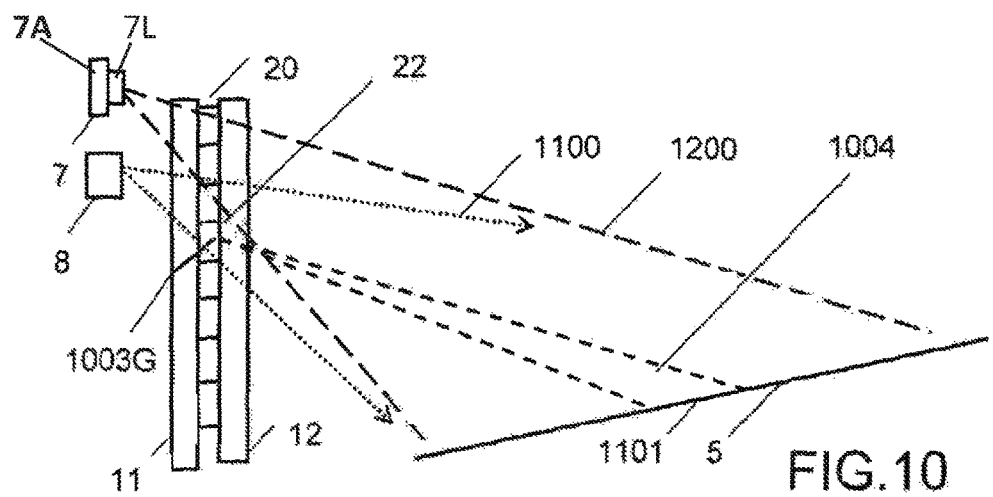
FIG. 10 is a schematic side elevation view of one embodiment of the invention incorporating an infrared source and infrared detector.
Figure 11:
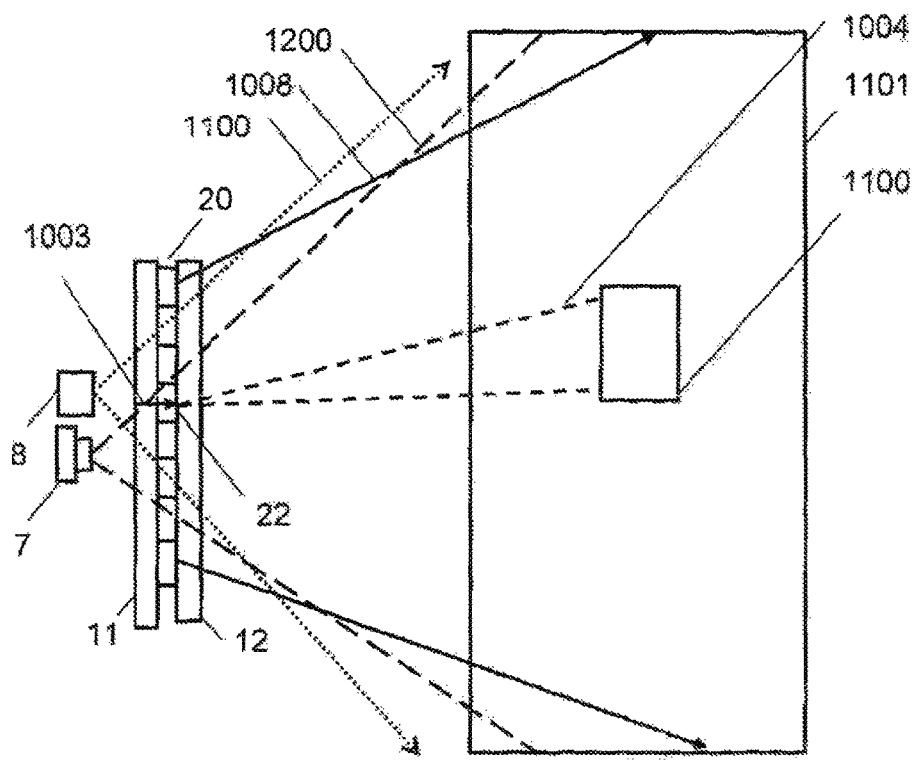
FIG. 11 is a schematic plan view of one embodiment of the invention incorporating an infrared source and an infrared detector.

FIGS. 10-11 show an embodiment similar to the one of FIGS. 4-5 in which there is further provided at least one infrared sensor 7, which may include an imaging sensor array 7A and a lens 7L and at least one infrared source such as 8. Advantageously, the sensor is a two dimensional infrared array. The infrared source illuminates the image surface 5 with the infrared beam indicated by 1100. The infrared sensor detects backscattered light from objects within a field of view indicated by 1200. The sensor is coupled to a processor which is in turn coupled to an image processor which is not illustrated. The optical system is illustrated in plan view in FIG. 11. Since the display is transparent one or both of the infrared sensor or source may be displayed on the opposite site of the display to the image surface as indicated in FIGS. 10-11. Alternatively, one or both of the infrared sensor or source may be disposed around the periphery of the display. In one embodiment of the invention a structured light pattern based on the ones illustrated in FIGS. 8-9 may be encoded within the SBG element. Alternatively, other structured lighting patterns may be used.

Figure 12:
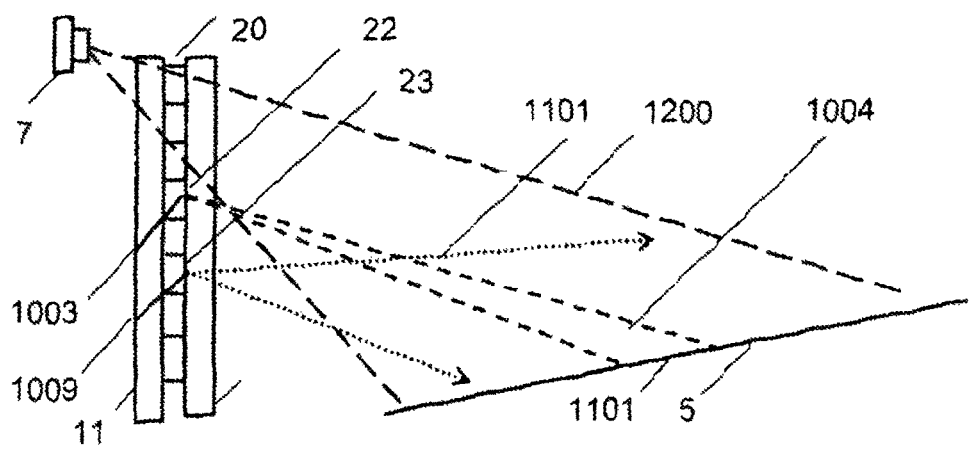
FIG. 12 is a schematic side elevation view of one embodiment of the invention incorporating an infrared source and an infrared detector.
Figure 13:
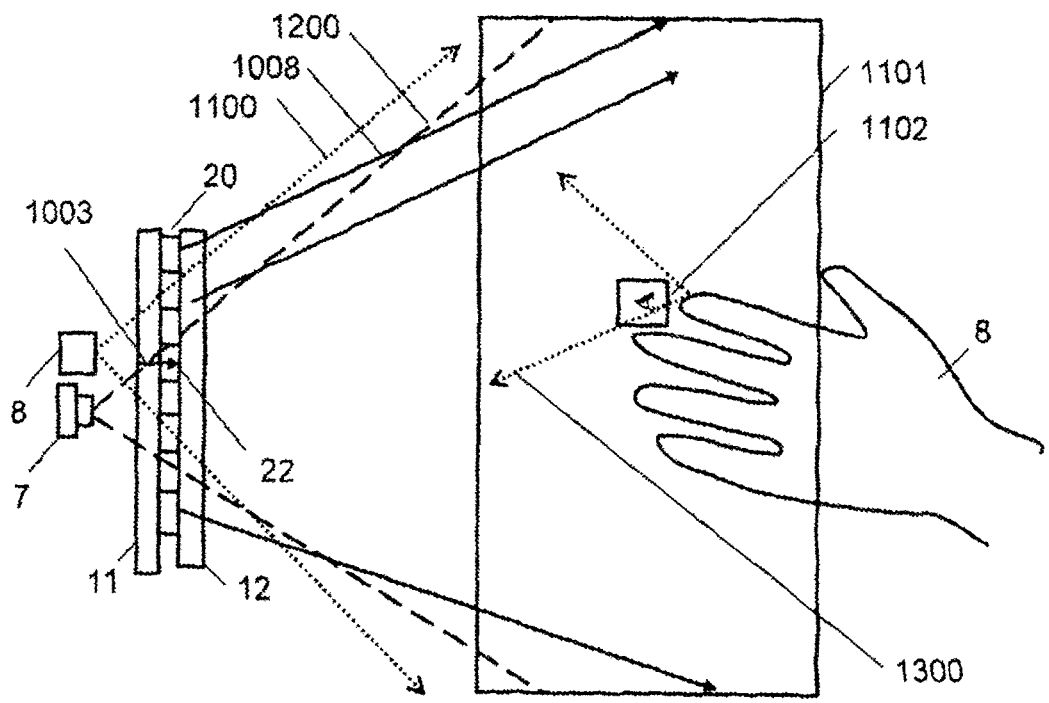
FIG. 13 is a schematic plan view of an embodiment of the invention that provides a virtual keyboard.

In one embodiment of the invention illustrated in the schematic side elevation view of FIG. 12 the infrared source may be coupled via the light guide to one or more dedicated SBG arrays elements contained in the SBG array. Totally internally reflected infrared light infrared light 1009 incident on an active infrared diffracted diffracting SBG element 23 is diffracted to provide the divergent infrared light beam 1101. In one embodiment of the invention a structured light pattern based one the ones illustrated in FIGS. 8-9 may be encoded within the SBG element. Alternatively, other structured lighting patterns may be used. In one embodiment of the invention more than one infrared diffracting SBG similar to the element 23 may be provided for the purpose of determining object range by triangulation. Such an implementation of the invention may be used to provide the instantaneous location of an object near the image surface. The invention does not rely on particular method for determining range from triangulation or determined the shape of an object using structured light. Tracking algorithms which are designed to determine the range or shape of an object by analyzing changes in sequential image frames recorded by a single sensor may also be used with the invention.

It will be clear from consideration of the above description that the invention may be used to provide more than one viewable image. In one embodiment of the invention based on the embodiments of FIGS. 10-12 there is provided a virtual computer keyboard projected by a single SBG element. The other SBG elements are used to project a live image, in other words an image that is updated on a frame-by-frame basis. One key with symbol A is indicated by 1102.

Figure 14:
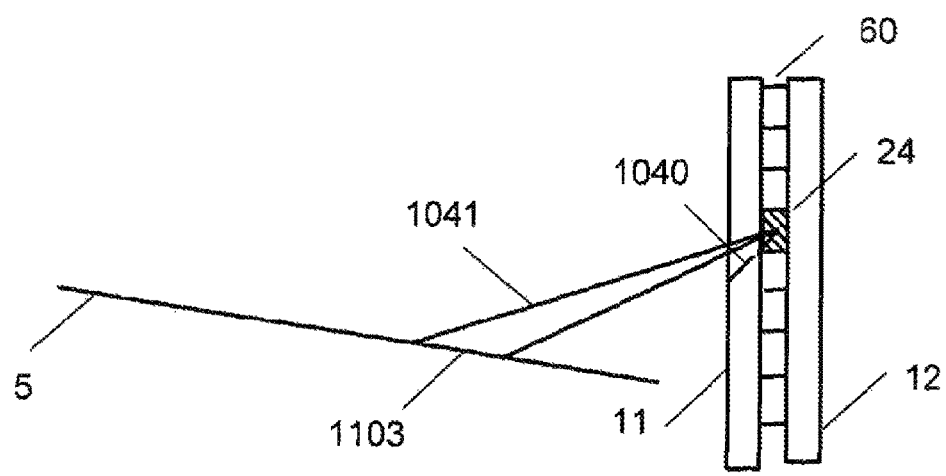
FIG. 14 is a schematic side elevation vies of an embodiment of the invention that uses reflective SBGs.

The infrared sensor 7 detects infrared light 1300 scattered from a finger 81 of the hand 8. An image processing system (not illustrated) determines whether the proximity of the finger to the key is sufficiently close for a key strike to have occurred. In other embodiments of the invention more than one SBG element may be used to project elements of the keyboard onto the image surface The SGB arrays in any of the above described embodiments of the invention may use SBG elements configured as wither transmissive or reflective gratings. In the embodiment illustrated in the schematic side elevation view of FIG. 14 the SBG device 60 is based on reflection gratings.

TIR light indicated by 1040 is reflected by the active SBG element 24 of the SBG device into the beam 1041 towards the image surface 51 forming the image 1103.

The SGB arrays in any of the above described embodiments of the invention may incorporate SBG elements designed to diffract thermal infra red radiation.

The SGB arrays in any of the above described embodiments of the invention may incorporate SBG elements designed to diffract ultraviolet radiation.

In one embodiment of the invention the image surface is a curved surface, including the retina of the human eye (item 5C in FIG. 3B).

Although the invention has been described in relation to what are presently considered to be the most practical and preferred embodiments, it is to be understood that the invention is not limited to the disclosed arrangements but rather is intended to cover various modifications and equivalent constructions included within the spirit and scope of the invention.

What is claimed is:

1. Apparatus for projecting an image onto a surface comprising:
   a first light source emitting light of a first wavelength;
   first and second multiplicities of separately switchable grating elements;
   transparent substrates sandwiching said grating elements providing a first light guide; and
   a means for coupling said first wavelength light into a total internal reflection path in said first light guide,
   each said grating element having a diffracting state and a non-diffracting state, wherein each element of said first multiplicity of grating elements when in its diffracting state diffracts said first wavelength light to form a focused first image region of predefined geometry and luminance distribution on said image surface,
   wherein each element of said first multiplicity of grating elements encodes wave-front amplitude and phase information corresponding to said geometry and luminance distribution,
   wherein each said element of said second multiplicity of grating elements provides a first unique speckle state under a first applied voltage and a second unique speckle state under a second applied voltage.

2. The apparatus of claim 1, further comprising transparent electrodes applied to said substrates, at least one of said transparent electrodes comprising a plurality of independently switchable transparent electrode elements each overlaying a unique grating element, wherein said diffracting state exists when no voltage is applied across said grating element via said transparent electrodes and said non diffracting state exists when a voltage is applied across said grating element via said transparent electrodes.

3. The apparatus of claim 1, wherein said switchable grating elements are Switchable Bragg Gratings.

4. The apparatus of claim 1, further comprising second and third light sources emitting light of second and third wavelengths and means for coupling said second and third wavelength light into total internal reflection paths in said first lightguide, wherein said first multiplicity of grating elements comprises a multiplicity of grating elements for diffracting said first wavelength light and a multiplicity of grating elements for diffracting said second wavelength light, wherein said second and third wavelength light is diffracted into second and third focused image regions of predefined geometry and luminance distribution on said image surface.

5. The apparatus of claim 4, wherein said first, second and third image regions substantially overlap.

6. The apparatus of claim 4, wherein each of said first, second and third wavelength multiplicities of grating elements are configured in rows and columns of a rectangular array, wherein grating elements in each of said rectangular arrays are switched sequentially into their diffracting states in bands comprising at least one row of grating elements, wherein no overlap exists between first, second and third wavelength grating element bands switched into their diffracting states.

7. The apparatus of claim 1, wherein said switchable grating elements are disposed in a single layer.

8. The apparatus of claim 1, wherein said first multiplicity of switchable grating elements is disposed in a first layer and said second multiplicity of switchable grating elements is disposed in a second layer.

9. The apparatus of claim 1, wherein the image surface is disposed in proximity to said display.

10. The apparatus of claim 1, wherein the image surface is more than 50 centimeters from said display.

11. The apparatus of claim 1, wherein one said image region comprises an image of a keyboard.

12. The apparatus of claim 1, wherein said image region is an image pixel.

13. The apparatus of claim 1, wherein said grating elements pre-distort the shape of said image region.

14. The apparatus of claim 1, wherein said image surface is a diffusing material.

15. The apparatus of claim 1, wherein said image surface is the retina of an eye.

16. The apparatus of claim 1, wherein said image surface is curved.

17. The apparatus of claim 1, further comprising: at least one infrared source; means for directing infrared light from said source towards said image surface and at least one infrared sensor operative to detect light scattered from an object disposed in proximity to said image surface.

18. The apparatus of claim 17, wherein said infrared source is a laser.

19. The apparatus of claim 17, wherein said infrared sensor comprises an image sensing array and lens.

20. The apparatus of claim 1, wherein said first multiplicity of grating elements contains at least one infrared diffracting grating element operative to diffract infrared light from said infrared source towards said image surface when said infrared diffracting grating element is in its diffracting state.

* * * * *